United States Patent
Hong et al.

(10) Patent No.: US 6,448,107 B1
(45) Date of Patent: Sep. 10, 2002

(54) PIN INDICATOR FOR LEADLESS LEADFRAME PACKAGES

(75) Inventors: Harry Kam Cheng Hong; Hu Ah Lek; Santhiran Nadarajah; Sharon Ko Mei Wan; Chan Peng Yeen, all of Melaka (MY); Jaime Bayan, Palo Alto; Peter Howard Spalding, Cupertino, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/724,729

(22) Filed: Nov. 28, 2000

(51) Int. Cl.⁷ .......................... H01L 21/44; H01L 21/48; H01L 21/50
(52) U.S. Cl. ....................... 438/106; 438/123
(58) Field of Search ................. 438/106, 107, 438/119, 123, 124, 127, 111, 112

(56) References Cited

U.S. PATENT DOCUMENTS

| | | | |
|---|---|---|---|
| 5,521,428 A | * 5/1996 | Hollingsworth et al. | 257/670 |
| 5,767,566 A | * 6/1998 | Suda | 257/666 |
| 5,891,760 A | * 4/1999 | Mekdhanasarn et al. | 438/123 |
| 5,954,842 A | * 9/1999 | Fogal et al. | 29/25.01 |
| 6,242,281 B1 | * 6/2001 | McIellan et al. | 438/106 |

* cited by examiner

Primary Examiner—David Nelms
Assistant Examiner—Phuc T. Dang
(74) Attorney, Agent, or Firm—Beyer Weaver & Thomas LLP

(57) ABSTRACT

Leadframe based packages, such as leadless leadframe packages are described that include an orientation indicator that is integrally formed with the leadframe. In one aspect, the leadframe includes a die attach pad, a plurality of contact fingers, a tie bar extending from the die attach pad, and an indicator stem extending from the tie bar. An integrated circuit die is mounted on the die attach pad and electrically coupled bond to associated contact fingers. A protective cap encapsulates the connectors and covers at least a portion of the die and contact fingers while leaving at least a portion of a bottom surface area of the contact fingers exposed to form external electrical contacts for the package. The protective cap leaves an identifying end of the indicator stem exposed through the surface of the protective cap to facilitate identification of a particular contact or region of the package. The described leadless leadframes may be produced in panel form which facilitates panel based packaging.

In some embodiments, the indicator stem extends perpendicularly upward from the tie bar such that the combined thickness of the indicator stem and the tie bar is substantially the same thickness as the thickness of the contact fingers. Such devices may be formed by selectively etching the tie bars during formation of the panels.

16 Claims, 8 Drawing Sheets

PIN INDICATOR FOR LEADLESS LEADFRAME PACKAGES

FIELD OF THE INVENTION

The present invention relates generally to leadless leadframe semiconductor packages. More specifically, the invention relates to pin indicators for identifying a selected contact pad or region in such packages.

BACKGROUND

A leadless leadframe package (LLP) is a relatively new integrated circuit package design that contemplates the use of a conductive (typically copper) leadframe type substrate structure in the formation of a chip scale package (CSP). As illustrated in FIGS. 1A–1C, in typical leadless leadframe packages, a copper leadframe strip or panel 101 is patterned (typically by stamping or etching) to define a plurality of device area arrays 103 of chip substrate features. Each chip substrate feature includes a die attach pad 107 and a plurality of contacts 109 disposed about their associated die attach pad 107. Very fine tie bars 111 are used to support the die attach pads 107 and contacts 109.

During assembly, dice are attached to the respective die attach pads and conventional wire bonding is used to electrically couple bond pads on each die to their associated contacts 109 on the leadframe strip 101. After the wire bonding, a plastic cap is molded over the top surface of each array 103 of wire bonded dice. The dice are then singulated and tested using conventional sawing and testing techniques.

FIG. 1D illustrates cross-sectional view of a typical resulting leadless leadframe package. The die attach pad 107 supports a die 120 which is electrically connected to its associated contacts 109 by bonding wires 122. A plastic cap 125 encapsulates the die 120 and bonding wires 122 and fills the gaps between the die attach pad 107 and the contacts 109 thereby serving to hold the contacts in place. It should be appreciated that during singulation, the tie bars 111 are cut and therefore the only materials holding the contacts 109 in place is the molding material. The resulting packaged chip can then be surface mounted on a printed circuit board or other substrate using conventional techniques.

Although leadless leadframe packaging has proven to be a cost effective packaging arrangement, there are continuing efforts to further reduce the costs associated with packaging. One persistent issue in packaging generally is the need and desire to provide an indication of the chip's orientation directly on the package. This insures that a device can readily be properly oriented when it is mounted on a printed circuit board (or other substrate). One common mechanism for doing this is to provide a visual identifying mark near a particular one of the pins (typically pin 1).

Various methods have been used to identify pin 1 on LLP's and other packages. Some methods use ink or lasers to create a mark on the molding material near pin 1. These methods are undesirable because ink applicating machines and lasers are required. To avoid the need for additional machines, markers have been formed directly on the leadframes during the chemical etching process that is used to form the leadless leadframes. For example, a protrusion along the edge of a die attach pad at a point adjacent to pin 1 may serve as a marker. Alternatively, a protrusion, i.e. stem, may be formed next to pin 1 such that it is exposed on the perimeter with the contact that surrounds the die attach pad. Unfortunately, the position of these protrusions occupies extra space in the semiconductor device and therefore effectively increases the required size of the devices. In the case of a protrusion on the edge of the die attach pad, a larger spacing is required between the die attach pad and the contacts.

In view of the foregoing, it would be advantageous to be able to provide a simple, low cost mechanism for providing pin identifying marks in leadless leadframe packages.

SUMMARY

The present invention is generally directed at leadframe based packages, such as leadless leadframe packages, that include an orientation indicator that is integrally formed with the leadframe. In one aspect, a leadless leadframe package is described in which the leadframe includes a die attach pad, a plurality of contact fingers, a tie bar extending from the die attach pad, and an indicator stem extending from the tie bar. An integrated circuit die is mounted on the die attach pad and appropriate connectors (such as bonding wires) electrically couple bond pads on the die to associated contact fingers. A protective cap (typically formed from a plastic material) encapsulates the connectors and covers at least a portion of the die and contact fingers while leaving at least a portion of a bottom surface area of the contact fingers exposed to form external electrical contacts for the package. The protective cap leaves an identifying end of the indicator stem exposed through the surface of the protective cap to facilitate identification of a particular contact or region of the package.

In some embodiments, the indicator stem extends perpendicularly upward from the tie bar such that the combined thickness of the indicator stem and the tie bar is substantially the same thickness as the thickness of the contact fingers. In other embodiments, the indicator stem extends to the side of the tie bar and is substantially the same thickness as the contact fingers. The indicator stem may have a wide variety of geometries.

In another aspect of the invention, a leadless leadframe panel for use in semiconductor packaging is described. The leadless leadframe panel is formed from a conductive sheet of material and has a two dimensional array of device areas defined thereon. Each device area includes a die attach pad, a plurality of contact fingers, a tie bar extending from the die attach pad and an indicator stem extending from the tie bar. The indicator stem has a thickness or height that permits an identifying end thereof to be substantially coplaner with an exposed surface of the contact fingers that the tie bar is not co-planer with. As suggested above, the device areas (which become the leadless leadframes in packaged devices) may have a wide variety of layouts and geometries.

In a method aspect of an invention, a method of producing the described leadless leadframe having integral indicator pins is described. An appropriate substrate panel that includes an array of device areas each having a die attach pad, contact fingers and at least one tie bar attached to the die attach pad is described. The tie bars are partially etched to reduce their heights, while leaving a portion (typically a relatively small portion) of at least some of the tie bars unetched to form the indicator stems. The indicator stems may then be used to identify a selected region or contact finger of the associated device area. The described panels may then be used to package an array of semiconductor devices.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1A:
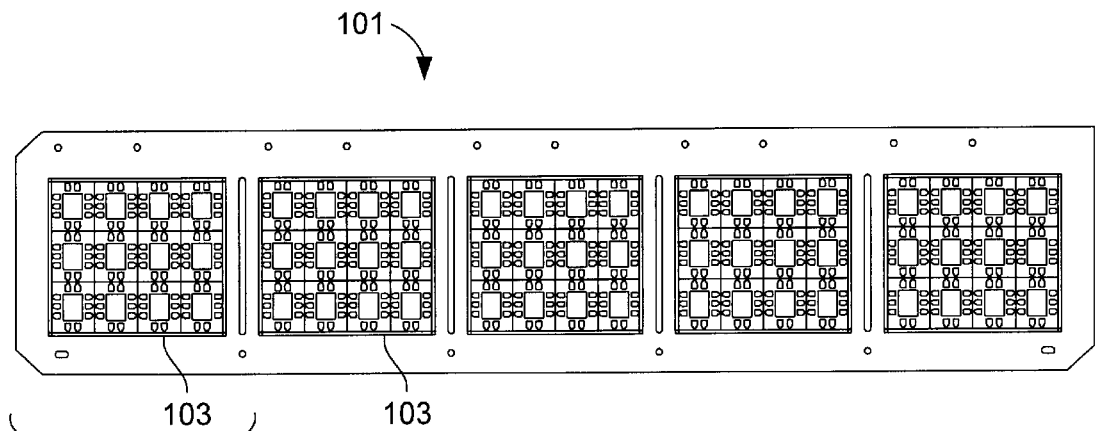
FIG. 1A is a diagrammatic bottom view of a conventional lead frame strip suitable for use in forming leadless leadframe packages.
Figure 1B:
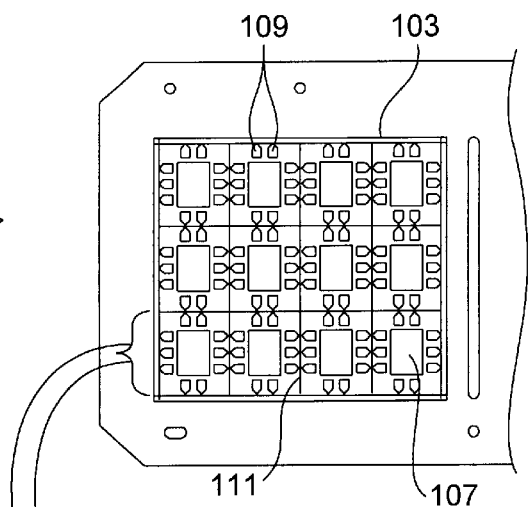
FIG. 1B is an enlarged diagrammatic bottom view of one end of the lead frame strip of FIG. 1A, illustrating an array of device areas.
Figure 1C:
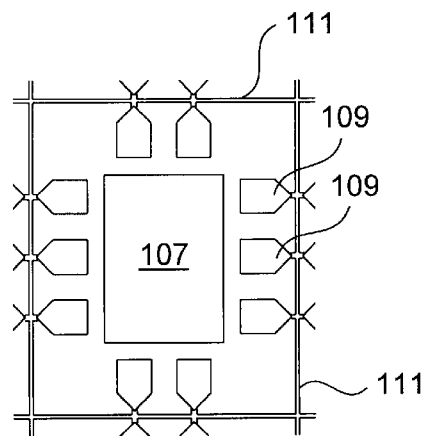
FIG. 1C is a further enlarged bottom view of a single device area.
Figure 1D:
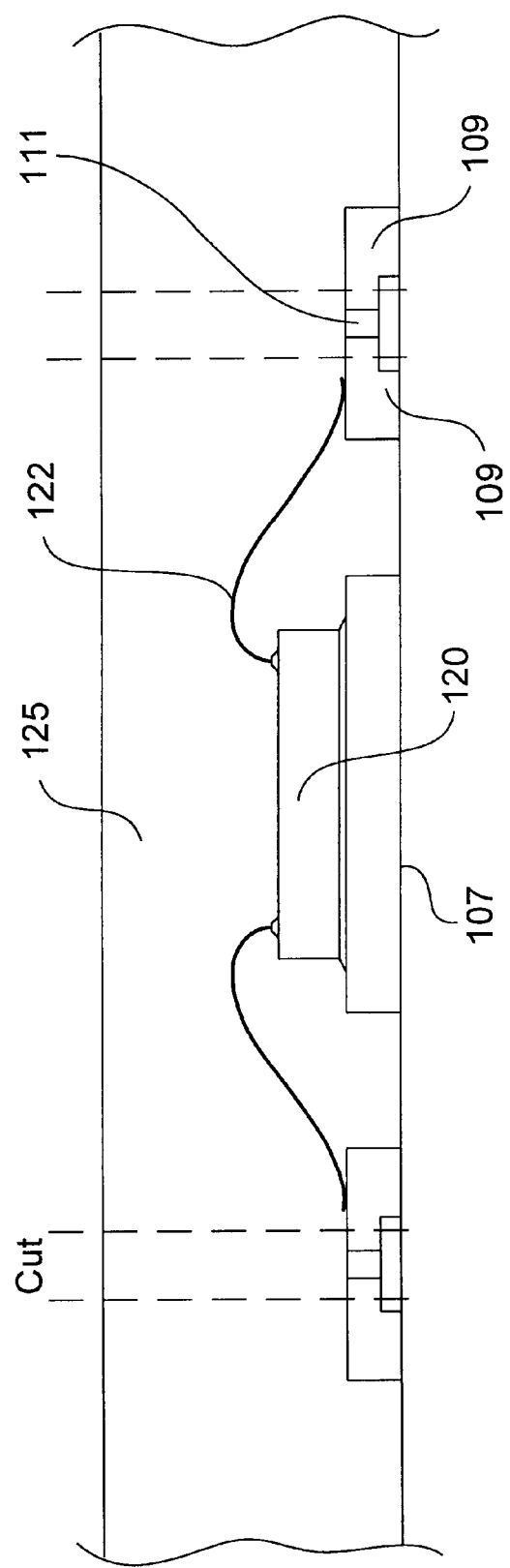
FIG. 1D is an enlarged diagrammatic cross sectional side view of a conventional leadless leadframe package.
Figure 2A:
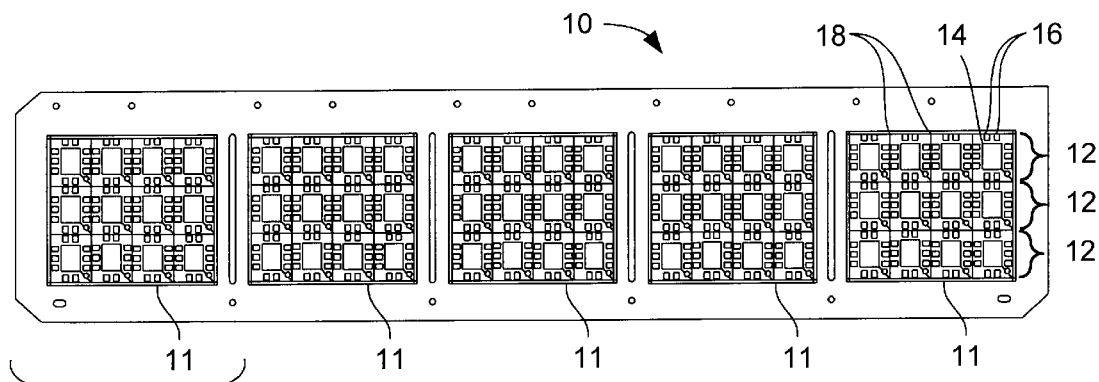
FIG. 2A illustrates a bottom plan view of a leadless leadframe according to one embodiment of the present invention.

FIG. 2A illustrates a bottom plan view of a panel 10 according to one embodiment of the invention. The panel 10 is a flat metal substrate having five separate active areas 11. Each of the active areas 11 are open areas within the panel 10, within which are suspended sets of individual device areas 12. The device areas 12 are arranged in rows and columns. Each device area 12 contains a set of electrical contact fingers 16 that are set around the perimeter of a rectangular die attach pad 14. Each of the die attach pads 14 and the contact fingers 16 are spaced apart from each other and are suspended from the panel 10 by their connection to the tie bars 18. The tie bars 18 run vertically and horizontally across each of the active areas 11 in equally spaced intervals. The shape and size of the electrical contact fingers may vary depending upon the specific design of the panel. For instance, the contact fingers may be elongated and flat, however, the contact fingers may just as well be round and flat (or any other shape).

Figure 2B:
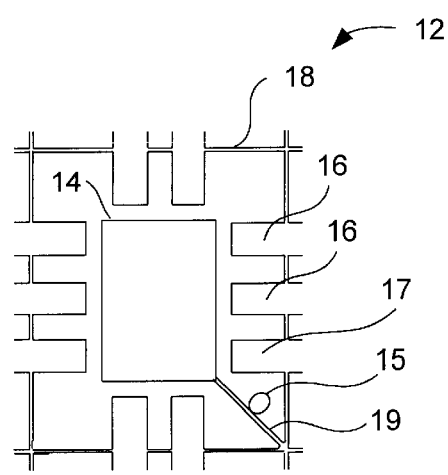
FIG. 2B illustrates a zoomed, bottom plan view of one device area of the leadless leadframe of FIG. 2A.

A zoomed view of one of the device areas 12 is illustrated in FIG. 2B. As discussed above, die attach pad 14 is supported amongst a set of contact fingers 16. The each of the contact fingers 16 are connected to one of the surrounding tie bars 18. The die attach pad is connected to and suspended by a die attach pad tie bar 19 (DAP tie bar), which extends diagonally from the tie bars 18. The DAP tie bar 19 connects to the tie bars 18 at the junction point between a vertical and a horizontal tie bar. Connected to the DAP tie bar 19 is an indicator stem 15, which is used to indicate the location of pin 1 17. As is known by those of ordinary skill in the art, pin 1 refers to a specific contact finger that determines the correct orientation when attaching the packaged semiconductor device onto a printed circuit board. The indicator stem 15 is a piece of metal extending off of the DAP tie bar 19 that will remain exposed through the molding material, which is applied during the semiconductor packaging process.

It should be noted that in alternative embodiments of panels, the DAP tie bar may have different configurations and connect to the tie bars 18 at different locations. For instance, a "straight" DAP tie bar may connect to a corner of a die attach pad and extend along a line parallel to one of the edges of the die attach pad. This DAP tie bar would extend along a contact finger located adjacent to the end of one edge of the die attach pad. The straight DAP tie bar connects to a single tie bar in a perpendicular orientation. Also, in alternative embodiments, the die attach pad may be suspended by more than one DAP tie bar. For example, four DAP tie bars may suspend a single die attach pad wherein each DAP tie bar extends from each corner of the die attach pad.

Another alternative embodiment of a panel has a Y-shaped DAP tie bar. The Y-shaped DAP tie bar, as will be shown in FIGS. 5 and 6, has a Y-shape such that it connects to the die attach pad at a single point and each of the branches of the Y connect to a vertical and horizontal tie bar.

Figure 3:
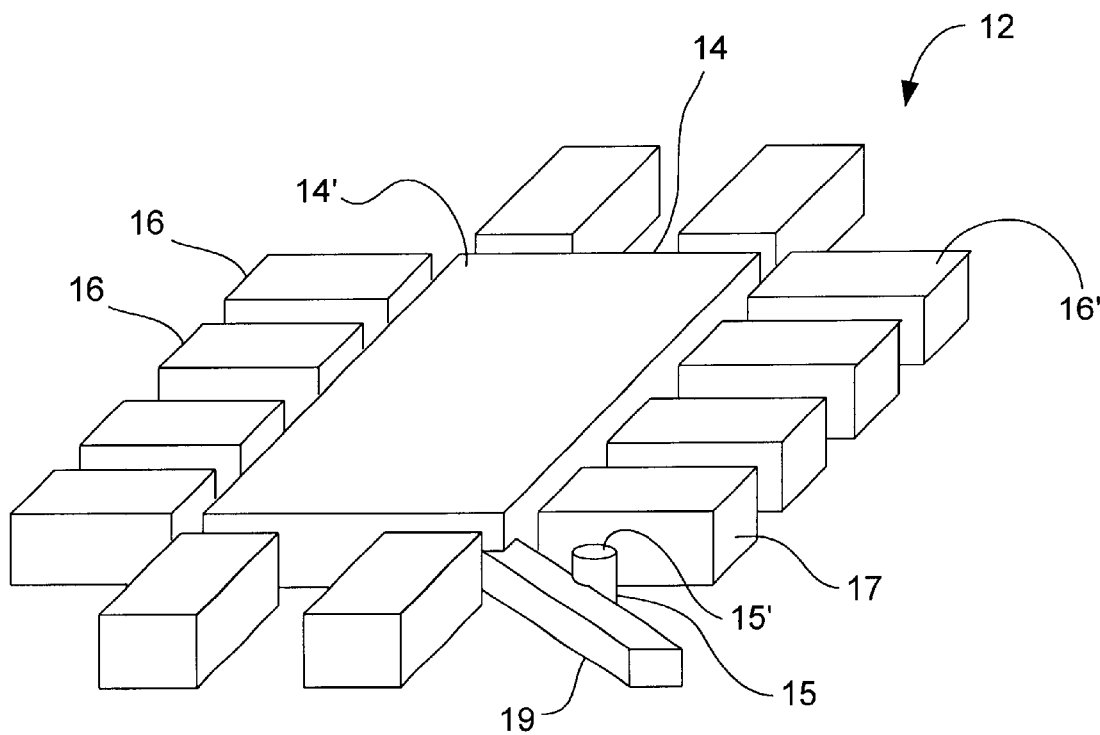
FIG. 3 illustrates a bottom plan, perspective view of the device area of FIG. 2B.

Now for further discussion relating to the device areas, refer to FIG. 3. FIG. 3 illustrates a perspective view of an isolated device area 12 without the associated tie bars. As described above, the die attach pad 14 is surrounded by contact fingers 16. It can now be seen more clearly that while the die attach pad 14 and the contact fingers 16 have contact surfaces 14' and 16', respectively, that lie in the same contact plane, the DAP tie bar does not have a surface that lies in the same contact plane. The DAP tie bar is connected to a point on the die attach pad 14 that is below the contact surface 14'. The indicator stem 15, however, extends from the DAP tie bar such that its indicator surface 15' is in the contact plane. With this configuration, only the surfaces, 14', 15', and 16' that are in the contact plane will be exposed through the molding material that will be applied during the semiconductor packaging process. The indicator stem 15 extends from a side of the DAP tie bar 19 and is in closer proximity to the pin 1 contact finger 17. Such positioning of the indicator stem 15 allows for easier identification of pin 1 during manufacturing processes, and shipping and handling steps. In alternative embodiments, the indicator stem may be positioned upon the center of the DAP tie bar. A centered DAP tie bar indicates a specific corner of a packaged semiconductor device and therefore is able to identify pin 1. Of course, the indicator stem may also be formed on any side of the DAP tie bar. The indicator stem 15 does not unnecessarily increase the size of the device area, and ultimately the semiconductor packages, since it is formed on the DAP tie bar 19, which has available surrounding space to accommodate the stem 15. Placing the indicator stem 15 on the DAP tie bar 19 conserves space along tie bars 18 and between pin 1 17 and the die attach pad 14.

The DAP tie bar 19 and the indicator stem 15 are formed by partially etching portions of the DAP tie bar. Methods for partially etching into materials is sometimes referred to as "half-etching." An exemplary process of forming the components within the individual device areas will now be explained. The leadless leadframe is initially formed from a flat piece of solid metal material. The die attach pads, tie bars and contact fingers are formed by chemically etching away the space between these components. Usually, the chemical etching is performed from both sides of the leadframe such that the chemical etchant dissolves the metal from each side until the space between the components is fully removed. By etching only one surface of the DAP tie bar and not etching the indicator stem, metal is removed from the DAP tie bar so that only the indicator stem extends into the plane with the die attach pad and contact fingers. An advantage of forming the indicator stem from the same chemical etching process used to manufacture the panel is that no specialized manufacturing steps are required. For example, an ink applicating machine or a laser is not required to form an identifying mark. In some embodiments of the panel, the die attach pad may be half-etched on the opposite surface from its contact surface such that the final packaged semiconductor device has an overall thinner dimension.

The contact surface 15' of the indicator stem 15 in FIG. 3 is has a circular outline. In different embodiments, the indicator stem 15 may have a variety of shapes, such as triangular, oval, linear etc. The shape of the contact surface 15' of the indicator stem 15 is not critical for indicating the pin 1 contact. However, the contact surface 15' of the indicator stem 15 may have a shape that points towards the pin 1 contact for easier identification purposes.

Figure 4:
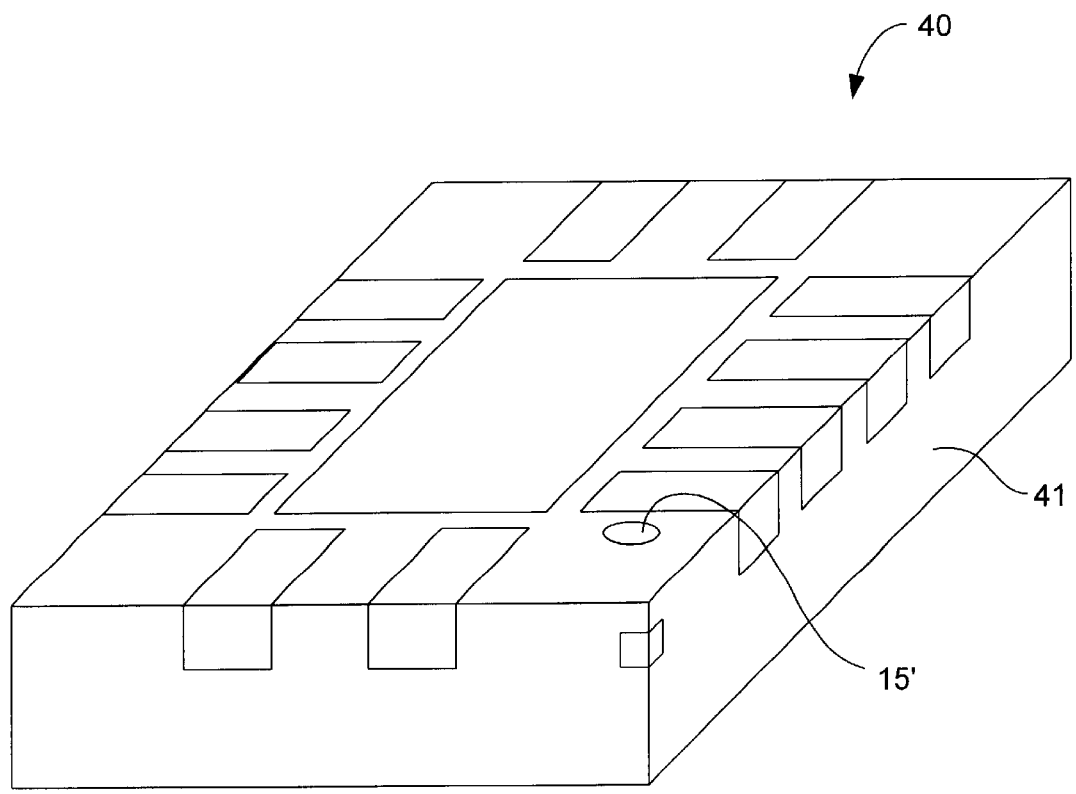
FIG. 4 illustrates a bottom plan, perspective view of a semiconductor package that is manufactured using the device area of FIG. 3.

FIG. 4 illustrates a bottom, perspective view of the packaged semiconductor device 40 that is ultimately formed from the device area 12 of FIG. 3. Liquid molding material is flood molded or injected so that the die attach pad, the contact fingers and the DAP tie bar are encapsulated. The contact surfaces of the die attach pad, the contact fingers and the identifying stem, however, remain exposed. After the molding material solidifies, the encapsulated components are fixed in place and the packaged semiconductor device 40 can be safely handled. The solidified molding material may be referred to as a molding cap. Within the packaged semiconductor device 40, is embedded a semiconductor die that is attached to the die attach pad. The input/output terminals of the semiconductor die are each connected through connectors (usually bonding wires) to respective contact fingers. The end of the indicator stem 15' is also exposed through the surface of the molding material 41.

Figure 5:
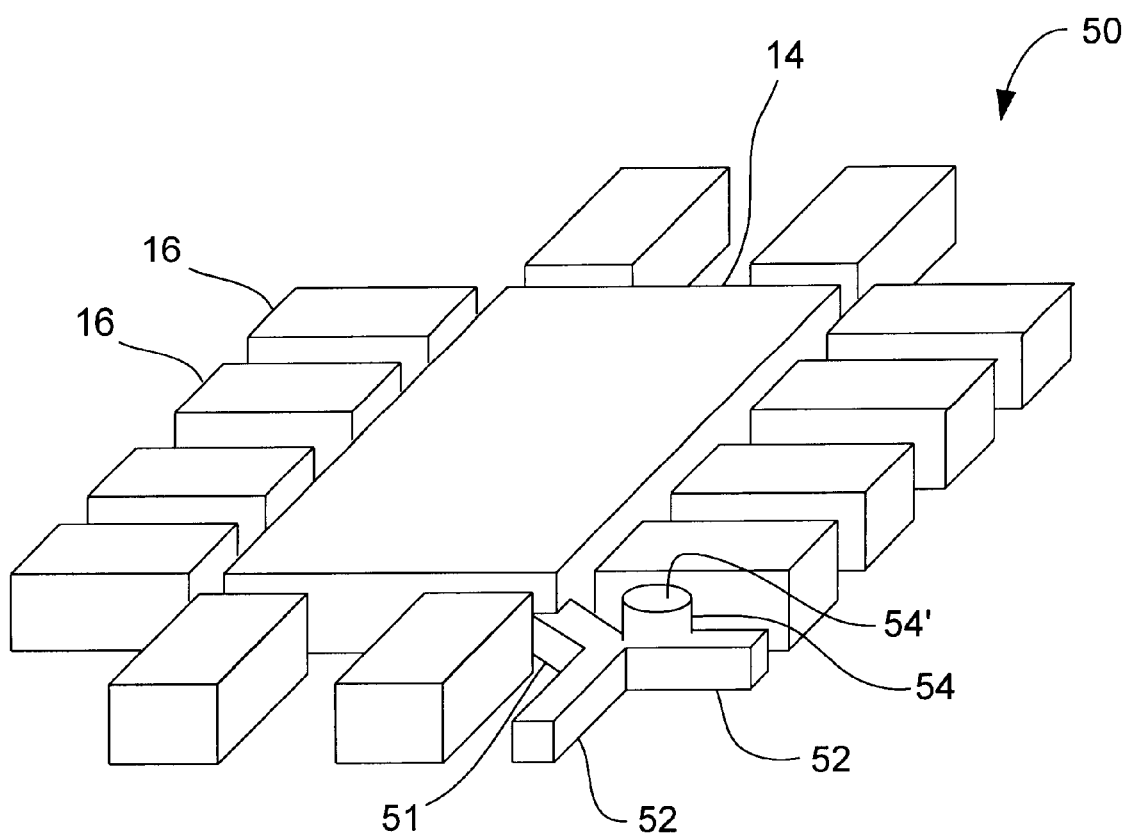
FIG. 5 illustrates a bottom plan, perspective view of an alternative embodiment of a device area.
Figure 6:
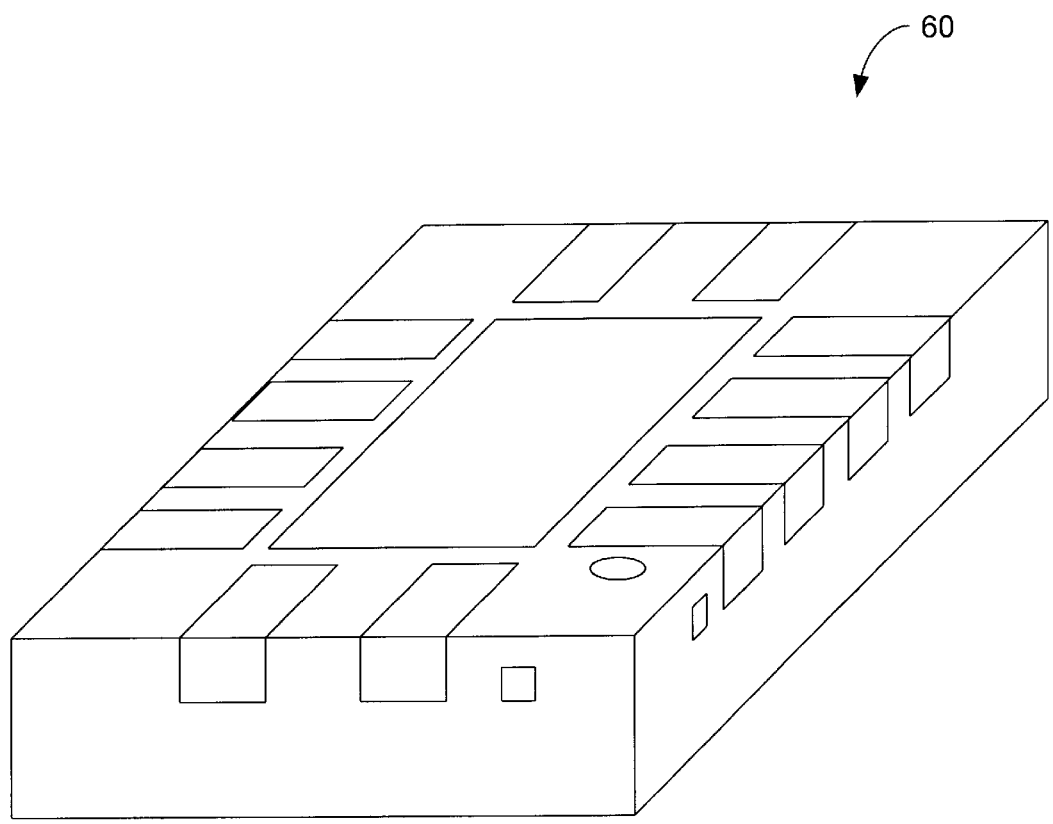
FIG. 6 illustrates a bottom plan, perspective view of a semiconductor package that is manufactured using the device area of FIG. 5.

FIG. 5 illustrates a bottom plan, perspective view of an alternative embodiment of an individual device area 50. The die attach pad 14 and the contact fingers 16 are arranged as describe in the previous embodiments. The DAP tie bar 51, however, is Y-shaped. One end of the DAP tie bar 51 is attached to the corner of the die attach pad 14. The two other ends 52 extend towards and are connected to respective tie bars (not shown). The indicator stem 54 is positioned on one of the branches of the Y-shaped DAP tie bar 51. The indicator stem 54 may also be positioned along the opposite branch of the DAP tie bar 51, at the intersection of the three branches, or on the branch that is connected to the die attach pad 14. In the shown embodiment, the thickness of the tie bar 51 and the indicator stem 54 combine to equal the thickness of the contacts 16. However, in other embodiments, the thickness of the tie bar and the indicator stem may not equal the thickness of the contacts. Again, note that the shape of the contact surface 54' of the indicator stem 54, although shown to be circular in shape, may be of any geometrical shape. FIG. 6 illustrates a bottom plan, perspective view of the packaged semiconductor device 60 that is ultimately formed from the device area 50 of FIG. 5.

Figure 7:
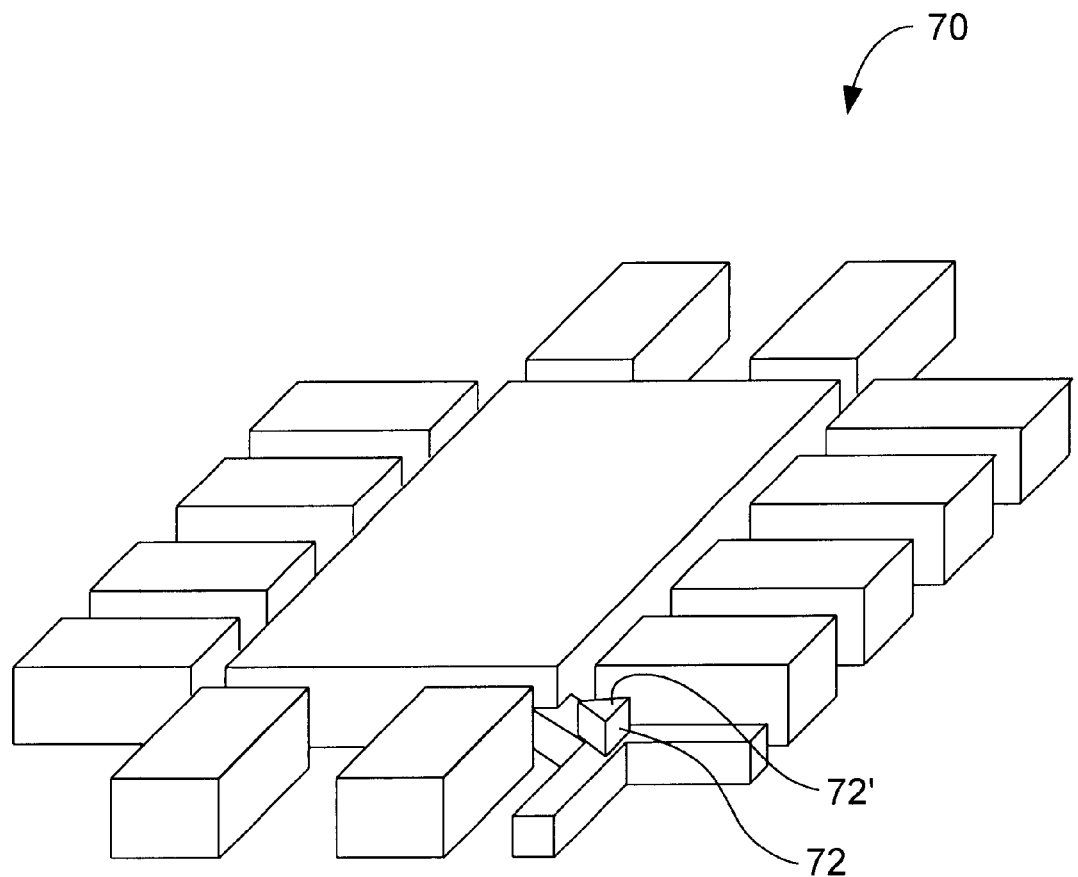
FIG. 7 illustrates a bottom plan, perspective view of yet another alternative embodiment of a device area.

FIG. 7 illustrates a bottom plan, perspective view of another alternative embodiment of an individual device area 70. The device area in FIG. 7 is similar to the device area in FIGS. 5 and 6 except that the indicator surface 72' of the indicator stem 72 is triangular in shape.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A packaged semiconductor device comprising:
   a leadless lead frame including a die attach pad, a plurality of contact fingers, a tie bar extending from the die attach pad, and an indicator stem extending from the tie bar;

an integrated circuit die mounted on the die attach pad, the integrated circuit die having a plurality of bond pads thereon;

a plurality of connectors that electrically couple respective bond pads to associated contact fingers; and a protective cap that encapsulates the connectors and covers the at least a portion of the die and contact fingers while leaving at least a portion of a bottom surface area of the contact fingers exposed to form external electrical contacts for the packaged semiconductor device while leaving an identifying end of the indicator stem exposed through the surface of the protective cap to facilitate identification of a particular contact finger or region of the packaged semiconductor device.

2. The packaged semiconductor device as recited in claim 1 wherein the thickness of the tie bar is less than the thickness of the contact fingers and the indicator stem is substantially the same thickness as the contact fingers such that the identifying end of the indicator stem remains exposed with the exposed regions of the contact fingers after formation of the protective cap.

3. The packaged semiconductor device as recited in claim 1 wherein the indicator stem extends perpendicularly upward from the tie bar.

4. The packaged semiconductor device as recited in claim 3 wherein the combined thickness of the indicator stem and the tie bar is substantially the same thickness as the thickness of the contact fingers.

5. The packaged semiconductor device as recited in claim 1 wherein the indicator stem has a cross-sectional area that has a shape selected from the group consisting of a triangle, a square, a rectangle, an oval, and a circle.

6. The packaged semiconductor device as recited in claim 4 wherein the tie bar is Y-shaped and the indicator stem extends perpendicularly upward from a leg of the Y-shaped tie bar such that the indicator stem is noticably closer to a selected one of the contact fingers than the other contact fingers.

7. The packaged semiconductor device as recited in claim 4 wherein the thickness of the tie bar is not more than approximately seventy-five percent (75%) of the thickness of the contact fingers.

8. The packaged semiconductor device as recited in claim 1 wherein the connectors are bonding wires and the leadless lead frame is formed from a metal material.

9. A leadless leadframe panel for use in semiconductor packaging, the leadless leadframe panel being formed from a conductive sheet of material and having a two dimensional array of device areas defined thereon, each device area comprising:

a die attach pad;

a plurality of contact fingers;

a tie bar extending from the die attach pad; and an indicator stem extending from the tie bar, wherein the indicator stem has a thickness or height that permits an identifying end thereof to be substantially coplaner with a surface of the contact fingers.

10. A panel of packaged integrated circuit devices comprising:

a leadless leadframe panel as recited in claim 9;

a plurality of integrated circuit dice, each die being mounted on an associated one of the die attach pads;

a multiplicity of interconnecting wires that electrically connect the dice to associated contact fingers within their associated device areas; and at least one protective cap that covers a plurality of the device areas thereby encapsulating their associated connectors while leaving at least a portion of a bottom surface area of the associated contact fingers exposed to form external electrical contacts and leaving the identifying ends of the associated indicator stems exposed to facilitate identification of a particular contact or region of each device area.

11. The leadless leadframe panel as recited in claim 9 wherein each indicator stem has a cross-sectional area that has a shape selected from the group consisting of a triangle, a square, a rectangle, an oval, and a circle.

12. The leadless leadframe panel as recited in claim 9 wherein:

the indicator stems extend perpendicularly upward from associated tie bars; and the combined thickness of each indicator stem and associated tie bar is substantially the same thickness as the thickness of the contact fingers.

13. A method for manufacturing a panel suitable for use in packaging integrated circuits, the method comprising:

providing a conductive substrate panel having a plurality of device areas defined thereon, each device area including a die attach pad, a plurality of contact fingers and at least one tie bar attached to the die attach pad; and partially etching the tie bars to reduce their thickness while leaving a portion of at least some of the tie bars unetched to form indicator stems that may be used to identify a selected region or contact finger of their associated device area.

14. The method as recited in claim 13 wherein the partial-etching operation is performed so that the indicator stem is formed in a position proximate to the first electrical contact within each set of electrical contacts.

15. The method as recited in claim 13 wherein the partial-etching operation forms an indicator stem having a cross-sectional area that has a shape selected from the group consisting of a triangle, square, rectangle, oval, and a circle.

16. The method of packaging integrated circuits comprising:

providing a panel formed as recited in claim 13;

attaching a semiconductor die to each of the die attach pads;

connecting each of the semiconductor dies to each electrical contact within each set of electrical contacts with an interconnecting wire; and applying a molding panel that at least partially encapsulates each of the die attach pads, tie bars, and indicator stems, wherein an identifying end of each indicator stem is exposed through the molding panel.

* * * * *